(12) United States Patent
Radu

(10) Patent No.: US 9,087,767 B2
(45) Date of Patent: Jul. 21, 2015

(54) PROCESS FOR MANUFACTURING A SEMICONDUCTOR STRUCTURE COMPRISING A FUNCTIONALIZED LAYER ON A SUPPORT SUBSTRATE

(75) Inventor: Ionut Radu, Crolles (FR)

(73) Assignee: SOITEC, Bernin (FR)

( * ) Notice: Subject to any disclaimer, the term of this patent is extended or adjusted under 35 U.S.C. 154(b) by 52 days.

(21) Appl. No.: 13/557,959

(22) Filed: Jul. 25, 2012

(65) Prior Publication Data
US 2013/0026608 A1    Jan. 31, 2013

(30) Foreign Application Priority Data

Jul. 28, 2011    (FR) ...................................... 11 56910

(51) Int. Cl.
*H01L 21/66* (2006.01)
*H01L 21/18* (2006.01)
*H01L 21/822* (2006.01)

(52) U.S. Cl.
CPC ........... *H01L 21/187* (2013.01); *H01L 21/8221* (2013.01)

(58) Field of Classification Search
CPC ................ H01L 2924/00; H01L 2924/00014; H01L 2924/00013; H01L 2224/83101; H01L 2924/14; H01L 2924/01005; H01L 2224/32225; H01L 2224/83192; H01L 2224/136; H01L 24/83; H01L 2224/49113; H01L 2224/81894; H01L 24/06; H01L 2224/81205; H01L 2224/83894; H01L 2224/29101; H01L 2224/293; H01L 2224/81203; H01L 2224/838; H01L 2224/94; H01L 2225/06517; H01L 2924/1517; H01L 21/2007; H01L 2224/116; H01L 2224/29287; H01L 2224/81201; H01L 2224/83193; H01L 2224/83851; H01L 21/76251; H01L 21/76885; H01L 2224/1147

USPC ........... 438/455, 458, 613, 107, 46; 257/E23.085, E21.002, E23.106, 257/E23.112, E23.172, E27.027, E27.111, 257/E29.003, 102, 758

See application file for complete search history.

(56) References Cited

U.S. PATENT DOCUMENTS

| 6,103,599 | A  | * | 8/2000  | Henley et al. ................. 438/459 |
| 7,919,392 | B2 | * | 4/2011  | Takafuji et al. ............... 438/455 |
| 8,241,995 | B2 | * | 8/2012  | Chen et al. .................... 438/455 |
| 8,241,996 | B2 | * | 8/2012  | Henley et al. ................. 438/458 |
| 8,461,017 | B2 |   | 6/2013  | Sadaka et al.                          |
| 8,557,679 | B2 | * | 10/2013 | Chuang et al. ................ 438/458 |
| 8,609,514 | B2 | * | 12/2013 | Moriceau et al. ............. 438/464 |
| 2008/0038932 | A1 | * | 2/2008  | Wagner ......................... 438/753 |
| 2008/0299742 | A1 | * | 12/2008 | Akiyama et al. .............. 438/458 |
| 2012/0003813 | A1 | * | 1/2012  | Chuang et al. ................ 438/458 |
| 2012/0107967 | A1 | * | 5/2012  | Or-Bach et al. .................. 438/4 |
| 2013/0241026 | A1 | * | 9/2013  | Or-Bach et al. .............. 257/506 |

FOREIGN PATENT DOCUMENTS

CN    102339769 A    2/2012

* cited by examiner

*Primary Examiner* — Stephen W Smoot
*Assistant Examiner* — Edward Chin
(74) *Attorney, Agent, or Firm* — TraskBritt

(57) ABSTRACT

The invention relates to a process for manufacturing a semiconductor structure comprising a functionalized layer on a support substrate, comprising the following steps: (a) implanting ionic species in a source substrate comprising the said functionalized layer and a sacrificial buffer layer located under the functionalized layer relative to the direction of implantation, to a depth delimiting the thickness of an upper part of the source substrate comprising the functionalized layer and at least part of the buffer layer; (b) bonding the source substrate to the support substrate; (c) fracturing the source substrate and transferring the upper part of the source substrate to the support substrate; (d) removing the buffer layer by selective etching with respect to the functionalized layer.

11 Claims, 1 Drawing Sheet

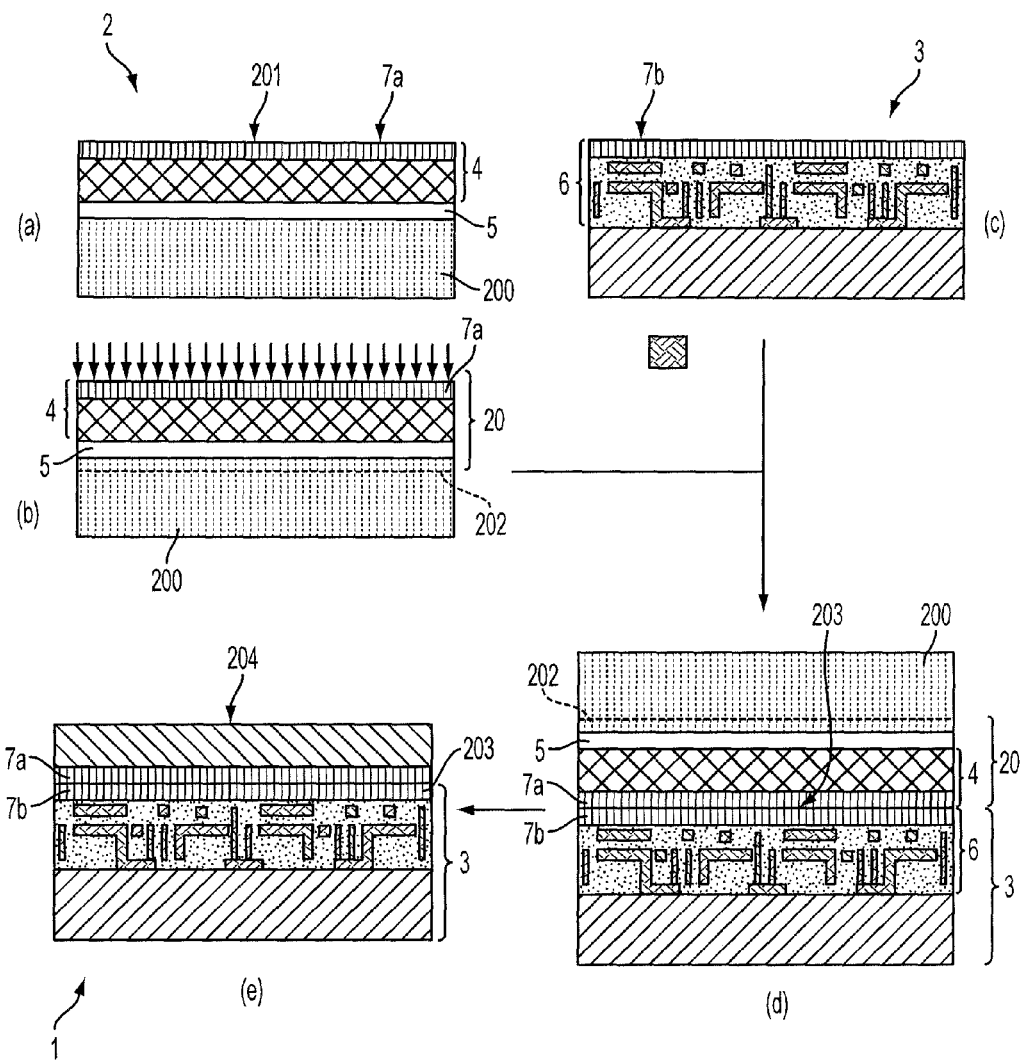

PROCESS FOR MANUFACTURING A SEMICONDUCTOR STRUCTURE COMPRISING A FUNCTIONALIZED LAYER ON A SUPPORT SUBSTRATE

PRIORITY CLAIM

This application claims the benefit of the filing date of French Patent Application Serial No. FR1156910, filed Jul. 28, 2011, for "PROCESS FOR MANUFACTURING A SEMICONDUCTOR STRUCTURE COMPRISING A FUNCTIONALIZED LAYER ON A SUPPORT SUBSTRATE," the disclosure of which is hereby incorporated herein in its entirety by this reference.

TECHNICAL FIELD

The field of the invention is that of semiconductor substrates used in the electronics, optics and optoelectronics industry, and more particularly in three-dimensional (3D) structures.

The invention relates more precisely to a process for manufacturing a semiconductor structure comprising a functionalized layer on a support substrate.

BACKGROUND

Semiconductor structures serve as a base for the formation of electronic, optoelectronic, etc., devices.

To improve the performance of such devices, methods for increasing the density of etched circuits per unit area have been developed.

The miniaturization of circuits, however, is physically limited.

Three-dimensional (3D) integration methods have been developed, in which, in addition to attempting to reduce the size of circuits, the circuits are stacked to form 3D structures and are connected via vertical interconnections.

In the present text, the term "vertical" means a direction perpendicular to the main face of the substrates in which these circuits are formed.

The manufacture of structures of this type requires the successive transfer, onto a support substrate, of the layers of which they are constituted, usually by means of a process referred to in the art as the SMARTCUT® process.

These layers are in fact produced separately on "source" substrates, in which an embrittlement zone delimiting the layer to be transferred is formed by implantation.

The transfer involves the successive bonding of each layer onto the support substrate or onto a layer already transferred onto the support substrate.

The bonding is often bonding by molecular adhesion.

The bonding is followed by an input of energy into the embrittlement zone so as to bring about cleavage of the source substrate along the embrittlement zone, the layer then being transferred onto the support substrate.

The upper surface of the transferred layer (i.e., the surface of the transferred layer that is opposite the surface bonded to the support substrate) has a certain level of roughness caused by the fracture or separation in the embrittlement zone.

It is known that a transfer of layers generally requires annealing operations subsequent to the bonding or to the transfer, which reinforce the molecular adhesion ("stabilizing" annealing) and/or which flatten the surface of the transferred layer ("smoothing" annealing).

However, such annealing operations are in certain cases problematic—especially that of the bonding of "functionalized" layers, used in 3D structures.

In the present text, the term "functionalized layer" (also known as the "active layer") means a semiconductor layer that has been processed to have one or more functionalities.

The functionalization may thus comprise doping (creation of a p-n junction), etching of "patterns" (e.g., designs obtained by removing material in order to create or define electronic microcomponents), formation of vertical electrical connections ("vias"), etc.

These active layers produced, however, are fragile and non-homogeneous.

An excessive temperature increase may thus damage the active layers and render them unusable.

It has been proposed to perform only low-temperature annealing operations (below 500° C.).

However, the Applicant has found that, in some cases, smoothing annealing at this temperature is insufficient to give the transferred active layer the required uniformity.

Moreover, a simple polishing step that could be performed after such annealing may be problematic since it could deteriorate the uniformity of the transferred layer.

Finishing is, thus, a step that is particularly difficult to perform, and the surface state obtained may be too rough (typically of the order of 10 nm rms, whereas the target roughness may be on the order of 1 nm or less) to be able to stack other active layers onto the structure obtained.

BRIEF SUMMARY

The invention is directed toward overcoming the drawbacks previously discussed.

The present invention is directed toward allowing the manufacture of 3D structures comprising a functionalized layer that has a good surface state without requiring a strong temperature increase.

Another aim of the present invention is generally to improve the processes for manufacturing semiconductor structures requiring a step of transfer of a functionalized layer in which it is not possible to exceed a temperature of about 500° C.

In order to achieve the objectives outlined above, the present invention relates to a process for manufacturing a semiconductor structure comprising a first functionalized layer on a support substrate, the process comprising the following steps:

(a) implanting ionic species in a source substrate comprising:
  the first functionalized layer, the first functionalized layer comprising at the surface a first metal conductive electrode, and
  a sacrificial buffer layer located under the first functionalized layer relative to the direction of implantation, wherein the ionic species are implanted at a depth delimiting the thickness of an upper part of the source substrate, the upper part comprising the first metal conductive electrode, the first functionalized layer and at least part of the sacrificial buffer layer;

(b) providing a support substrate comprising a second functionalized layer, the second functionalized layer comprising at the surface a second metal conductive electrode;

(c) bonding the source substrate to the support substrate, the first metal electrode and the second metal electrode being at the bonding interface;

(d) fracturing the source substrate and transferring the upper part of the source substrate from the source substrate to the support substrate; and (e) removing the sacrificial buffer layer by selective etching with respect to the functionalized layer.

The sacrificial buffer layer is thus preferably made of a material that allows selective etching with respect to the material of the first functionalized layer.

According to one advantageous embodiment of the invention, the sacrificial buffer layer comprises a layer for confinement of the implanted species.

For example, the confinement zone is a zone of the sacrificial buffer layer that is doped with boron.

Preferably, the thickness of the sacrificial buffer layer is between 10 nm and 1 µm.

According to one particular embodiment of the invention, the sacrificial buffer layer is made of silicon dioxide.

In this case, the selective etching of the sacrificial buffer layer is advantageously wet chemical etching with acid, in particular with hydrofluoric acid.

Moreover, a heat treatment for repairing the defects of the transferred first functionalized layer at a thermal budget lower than a thermal budget at and above which the first functionalized layer or the support substrate is damaged may also be applied.

The bonding step (c) may comprise the application of stabilizing annealing at a temperature of between 200° C. and 500° C.

According to one particular embodiment of the invention, the support substrate also comprises a second functionalized layer.

For example, the first functionalized layer of the source substrate and/or the second functionalized layer of the support substrate comprise an electrode located at the bonding interface, the electrode(s) providing an electrical contact between the first functionalized layer of the source substrate and the second functionalized layer of the support substrate.

The first metal electrode and the second metal electrode are advantageously made of a metal chosen from tungsten, titanium, platinum, cobalt, nickel and palladium.

BRIEF DESCRIPTION OF THE FIGURE

Other characteristics and advantages of the present invention will emerge on reading the description that follows of one preferential embodiment. This description will be given with reference to the attached drawings, in which FIG. 1 is a scheme representing the steps of the process for manufacturing a semiconductor structure according to the invention.

DETAILED DESCRIPTION

Formation of the Source Substrate Comprising a First Functionalized Layer

FIG. 1(a) illustrates an example of a source substrate 2.

The source substrate 2 is a bulk or composite substrate (e.g., formed from a stack of layers of different materials) made of any semiconductor or non-semiconductor material.

The source substrate 2 comprises, on one of its faces, referred to as the "upper face," a first functionalized layer 4.

The first functionalized layer 4 may comprise a p-n junction and/or a superposition of several layers of different materials.

Advantageously, the first functionalized layer 4 may comprise, at the surface, a conductive first metal electrode 7a. For example, the first metal electrode 7a may comprise one or more metals chosen from W, Ti, Pt, Pd, Ni, Co, etc.

When such a first metal electrode 7a is present, its thickness must be small enough to allow the implantation of ionic species such as hydrogen and/or helium through the electrode 7a.

Thus, the thickness of the first metal electrode 7a is typically less than 0.5 µm.

The upper surface 201 of the first functionalized layer 4 is a free surface of the source substrate 2, intended to be bonded to a support substrate in order to transfer the first functionalized layer 4 onto the support substrate.

Under the first functionalized layer 4 is a buffer layer 5 which, as described later, is a sacrificial layer intended for finishing the semiconductor structure obtained after transferring the first functionalized layer 4 onto the support substrate.

In this regard, the sacrificial buffer layer 5 is made of a material that is able to be selectively removed with respect to the material of the first functionalized layer 4.

For example, if the first functionalized layer 4 comprises highly doped silicon, the sacrificial buffer layer 5 may be made of undoped or sparingly doped silicon.

According to another example, if the first functionalized layer 4 comprises one or more silicon-based materials, the sacrificial buffer layer 5 may be made of silicon dioxide ($SiO_2$).

To form the source substrate 2, the sacrificial buffer layer 5 is formed on a base substrate 200, and the first functionalized layer 4 is then formed on the sacrificial buffer layer 5.

The formation of the sacrificial buffer layer 5 may be performed via any suitable technique as a function of the chosen material.

For example, the sacrificial buffer layer 5 may be formed via any deposition or epitaxy technique, or, alternatively, if it consists of an oxide of the base substrate 200, by oxidation of the base substrate 200.

The thickness of the sacrificial buffer layer 5 may be chosen to be between 10 nm and 1 µm.

The formation of the sacrificial buffer layer 5 is optionally followed by a finishing step intended to promote the formation of the first functionalized layer 4.

The finishing process may comprise wet etching, dry etching, polishing, or a combination of these processes.

The formation of the first functionalized layer 4 is performed via any suitable technique as a function of the nature of the first functionalized layer 4.

For example, if the first functionalized layer 4 comprises a conductive first metal electrode 7a, it may be formed by deposition of one or more layers of the appropriate metal(s).

The formation of the first functionalized layer 4 may comprise deposition over the entire surface of the sacrificial buffer layer 5, if the first functionalized layer 4 is continuous.

Alternatively, if the first functionalized layer 4 is formed from patterns, the formation of the first functionalized layer 4 may involve the formation of a mask for selective deposition in order to obtain the desired patterns.

In general, the first functionalized layer 4 may be formed via any method known in the field of semiconductor processing (etching, lithography, implantation, deposition, etc.) and its formation may also involve transfer from another substrate.

Masking and selective deposition methods are well known in the field of semiconductor materials and a person skilled in the art is capable of selecting the appropriate method as a function of the materials, the geometry of the patterns, etc. from all those that are at his disposal.

Embrittlement of the Source Substrate

With reference to FIG. 1(b), an implantation of species through the first functionalized layer 4 is performed in the source substrate.

The implanted species are, for example, hydrogen, helium, nitrogen and/or argon.

The implantation energy is chosen such that the implantation peak, i.e., a plane 202 in which a majority of atoms are implanted, is in the sacrificial buffer layer 5, or even at a greater depth, in the base substrate 200. It is this latter case that is illustrated in FIG. 1(b).

The implantation energy may be determined via preliminary simulations, for example, using the SRIM software.

As a guide, in the case of hydrogen implantation, the implantation energy is between 10 and 250 keV.

As regards the implanted dose, it must be sufficient to allow subsequent cleavage of the source substrate 2 along the embrittlement plane 202.

In this regard, it is considered that, in the case of hydrogen, the implanted dose should typically be between $2 \times 10^{16}$ and $2 \times 10^{17}$ cm$^{-2}$.

According to a particularly advantageous mode of the invention, the buffer layer comprises a zone (not shown) for confining the implanted species.

The confinement zone may be, for example, a zone of the buffer layer doped with boron. A boron-doped buffer layer may be made via standard methods of epitaxy or of implantation of boron into silicon.

In this case, the implantation energy is chosen such that the implantation peak is in the sacrificial buffer layer 5.

The confinement zone then has the effect of concentrating the implanted atoms, which makes it possible to obtain fracture with less energy input than in the absence of the confinement zone, especially by employing a reduced thermal budget.

Moreover, this lower energy input makes it possible to reduce the risk of detachment of the bonding interface during the fracture of the source substrate.

Moreover, the implantation may be performed in a single step or sequentially.

In the case of a single step, the implantation is performed after the formation of the first functionalized layer 4 in the source substrate 2, and the implanted species pass through the first functionalized layer 4.

Specifically, if the implantation were performed before the formation of the first functionalized layer 4, the heat treatments employed during the formation of the layer would be liable to affect the implanted zone, for example, by blistering.

Alternatively, the implantation is performed sequentially, e.g., in several steps with doses whose total is the dose required to allow cleavage of the source substrate along the embrittlement plane 202.

Thus, part of the total dose (for example, 10%) may be implanted before functionalization of the layer, and the rest (for example, 90%) after its functionalization. This makes it possible to limit the effects of the implantation on the first functionalized layer 4.

Moreover, a single species or several species may be implanted, simultaneously or sequentially.

The sacrificial buffer layer 5 has the advantage of distancing the embrittlement plane 202 (and thus the fracture front) from the first functionalized layer 4, which makes it possible to reduce the risk of damaging the functionalized layer by the implanted ions.

Bonding of the Source Substrate to a Support Substrate

The support substrate intended to receive the first functionalized layer 4 may be chosen solely to serve as a mechanical support (stiffener) for the layer, which is very thin, without having any particular electrical functions (Si substrate that has not undergone any particular treatment, glass, metallic substrate, etc.).

Alternatively, the support substrate may itself comprise a second functionalized layer 6 intended to co-operate with the first functionalized layer 4 during the functioning of the final semiconductor structure.

FIG. 1(c) illustrates an example of such a support substrate 3, in which the second functionalized layer 6 comprises at its surface a metal electrode 7b.

The functionalization of the support substrate 3 may thus comprise the use of a process for manufacturing electronic devices (the support substrate 3 may be, for example, a CMOS structure) and/or the formation of electrical interconnections and/or the metallization of the substrate.

As illustrated in FIG. 1(d), the source substrate 2 (FIGS. 1(a) and 1(b)) is bonded to the support substrate 3 (of FIG. 1(c)) via the first functionalized layer 4.

This is direct bonding (e.g., without an additional layer being interposed between the first functionalized layer 4 and the support substrate 3), by molecular adhesion. In other words, direct atomic bonds may be established between the first functionalized layer 4 and the surface of the support substrate 3.

Where appropriate, if the support substrate 3 comprises a second functionalized layer 6, the bonding is performed directly between the first functionalized layer 4 of the source substrate 2 and the second functionalized layer 6 of the support substrate 3.

In the case illustrated in FIG. 1(d), the source substrate 2 and the support substrate 3 are bonded via first metal electrode 7a and second metal electrode 7b.

Preferably, bonding of two identical metals (for example, Al—Al, W—W, Ti—Ti, Pt—Pt, Cu—Cu, etc.) is favored, although it is possible to bond two layers of different materials (for instance W—Cu).

The bonding may be performed between two continuous metal layers (i.e., covering the entire bonding interface 203) but also, where appropriate, between two discontinuous, patterned metal layers.

In this case, the bonding interface 203 is electrically active (i.e., it allows the passage of electrons between the support substrate 3 and the transferred first functionalized layer 4).

A heat treatment may be performed after bonding so as to reinforce the bonding energy at the interface 203.

It is in fact necessary for this bonding energy to be sufficient, in order that, during the subsequent detachment step, cleavage can take place along the plane 202 of the source substrate 2 and not along the bonding interface 203.

This heat treatment is typically performed at a temperature above 200° C., without exceeding a temperature beyond which the first functionalized layer 4 would risk being degraded.

In general, this heat treatment may be performed at a temperature below 500° C.

Fracture and Separation

Fracture of the source substrate 2 is then brought about along the embrittlement plane 202.

To this end, a mechanical, thermal and/or other force is applied, which brings about fracture of the source substrate 2 along the plane 202.

If a heat treatment is applied, it should correspond to a thermal budget below a thermal budget that would risk degrading the first functionalized layer 4.

Typically, the fracture heat treatment is performed at a temperature below 500° C.

The remainder of the source substrate 2 may then be detached, and optionally may be recycled.

The resulting structure comprises the support substrate 3 and the transferred upper part 20 of the source substrate 2, which comprises the first functionalized layer 4 covered either with part of the sacrificial buffer layer 5 (if the embrittlement plane 202 were located in the sacrificial buffer layer 5), or with the sacrificial buffer layer 5 and part of the base substrate 200 (if the embrittlement plane 202 were located in the base substrate 200, as illustrated in FIG. 1(d)).

To obtain the final semiconductor structure 1 illustrated in FIG. 1(e), which comprises the support substrate 3 and the first functionalized layer 4, the sacrificial buffer layer 5 is removed, along with, where appropriate, any residual portion of the base substrate 200.

To this end, polishing may be performed (for example, chemical-mechanical polishing (CMP)) to remove any residue of the base substrate 200, followed by dry or wet selective etching in which the etching agent allows etching of the material of the sacrificial buffer layer 5 without substantial etching of the material of the first functionalized layer 4.

A person skilled in the art is capable of selecting a suitable product among the agents available on the market, taking into account the materials of the sacrificial buffer layer 5 and of the active layer 4.

Thus, by way of example, in the case of a $SiO_2$ sacrificial buffer layer 5, wet etching based on 10% HF (hydrofluoric acid) may be used.

This removal of the sacrificial buffer layer 5 makes it possible to remove from the final semiconductor structure 1 a majority of the defects introduced during the implantation and to obtain a free surface 204 of the first functionalized layer 4 that is sufficiently smooth.

In the preceding example, the case of an $SiO_2$ sacrificial buffer layer 5 etched via wet etching based on 10% HF makes it possible to obtain roughness of less than 0.5 nm on the first functionalized layer 4.

The use of the sacrificial buffer layer 5 thus makes it possible to dispense with a heat treatment for smoothing of the first functionalized layer 4. Thus, in some embodiments, the methods may not include any heat treatment process for smoothing the first functionalized layer 4.

Other finishing heat treatments may optionally be applied to repair the defects caused by the implantation and to improve the functionality of the first functionalized layer 4.

Conventionally, these heat treatments are performed in an oven or in an RTA (rapid thermal annealing) treatment device.

In all cases, these heat treatments are performed at a thermal budget that depends on the nature of the first functionalized layer 4 (especially the doping profile, the nature of the metals employed to form the conducting electrodes and/or the interconnections, etc.), which remains lower than a thermal budget that would run the risk of damaging or impairing the functioning of the first functionalized layer 4 transferred onto the support substrate 3.

After these various treatments, it is possible, according to the semiconductor structure that it is desired to obtain, to transfer a new functionalized layer onto the first functionalized layer 4.

The low surface roughness of the first functionalized layer 4 in fact enables such a transfer to be performed.

What is claimed is:

1. A method of manufacturing a semiconductor structure, comprising:
providing a source substrate comprising a first support substrate, a first functionalized layer on the first support substrate, and a sacrificial buffer layer comprising a material that allows selective etching of the sacrificial buffer layer with respect to a material of the first functionalized layer, the sacrificial buffer layer comprising a layer for confinement of the implanted species, the first functionalized layer including a first metal conductive electrode at a surface of the first functionalized layer, the sacrificial buffer layer located between the first functionalized layer and the first support substrate;
after providing the source substrate, implanting ionic species into the source substrate through the first functionalized layer, wherein the ionic species are implanted at a depth delimiting a thickness of an upper part of the source substrate, the upper part comprising the first metal conductive electrode, the first functionalized layer, and at least part of the sacrificial buffer layer;
providing a second support substrate including a second functionalized layer, the second functionalized layer including a second metal conductive electrode at a surface of the second functionalized layer;
bonding the source substrate to the second support substrate, the first metal electrode and the second metal electrode being at a bonding interface;
fracturing the source substrate and transferring the upper part of the source substrate from the source substrate to the second support substrate; and
removing the sacrificial buffer layer by selective etching with respect to the first functionalized layer.

2. The method of claim 1, wherein the layer for confinement of the implanted species comprises a confinement zone of the sacrificial buffer layer that is doped with boron.

3. The method of claim 1, wherein a thickness of the sacrificial buffer layer is between 10 nm and 1 μm.

4. The method of claim 1, wherein the sacrificial buffer layer comprises silicon dioxide.

5. The method of claim 4, wherein the selective etching of the sacrificial buffer layer comprises wet chemical etching with acid.

6. The method of claim 1, further comprising applying a heat treatment for repairing defects in the transferred first functionalized layer at a thermal budget lower than a thermal budget at and above which the first functionalized layer or the second support substrate is damaged.

7. The method of claim 1, wherein bonding the source substrate to the second support substrate comprises annealing the source substrate and the second support substrate at a temperature of between 200° C. and 500° C.

8. The method of claim 1, wherein the first metal electrode and the second metal electrode comprise a metal selected from the group consisting of tungsten, titanium, platinum, cobalt, nickel and palladium.

9. The method of claim 5, wherein wet chemical etching with acid comprises etching with hydrofluoric acid.

10. The method of claim 2, wherein a thickness of the sacrificial buffer layer is between 10 nm and 1 μm.

11. The method of claim 10, wherein the sacrificial buffer layer comprises silicon dioxide.

* * * * *